United States Patent [19]

Craft et al.

[11] Patent Number: 5,612,693
[45] Date of Patent: Mar. 18, 1997

[54] SLIDING WINDOW DATA COMPRESSION USING A TOROIDAL BIT SHIFT REGISTER

[75] Inventors: David J. Craft, Austin; Oscar C. Strohacker, Dripping Springs, both of Tex.

[73] Assignee: International Business Machines Corporation, Armonk, N.Y.

[21] Appl. No.: 355,865

[22] Filed: Dec. 14, 1994

[51] Int. Cl.⁶ .................................................... H03M 7/30
[52] U.S. Cl. ............................................. 341/51; 341/67
[58] Field of Search ........................ 341/51, 67; 382/232, 382/244, 234; 395/888

[56] References Cited

U.S. PATENT DOCUMENTS 5,369,605 11/1994 Parks.

Primary Examiner—Jeffrey A. Gaffin
Assistant Examiner—Jason L. W. Kost
Attorney, Agent, or Firm—Casimer K. Salys

[57] ABSTRACT

Systems and methods for compressing data. Lempel-Ziv data compression is applied in the context of an exhaustive sliding window implementation using a large character history bit pattern memory. Shifted updating of the character history bit pattern memory is accomplished through a pointer system. Linear patterns of bits, derived by COPY function from the character history bit pattern memory or by bit wise AND logic combination of selected bit patterns, are circularly shifted in synchronism with new data characters using a toroidal bit shift register. The relatively long bit strings subject to shifting are converted to a matrix format, shifted with fewer affected bits and returned to a linear format. The systems and methods materially improve the speed of exhaustive sliding window data compression as accomplished by general purpose processors.

14 Claims, 11 Drawing Sheets

SLIDING WINDOW DATA COMPRESSION USING A TOROIDAL BIT SHIFT REGISTER

CROSS-REFERENCE TO RELATED APPLICATIONS

The invention in the present application is related to the subject matter in U.S. patent application Ser. No. 08/537,569, filed Oct. 2, 1995, which is a continuation of Ser. No. 08/290,451, filed Aug. 15, 1994, now abandoned, which is a continuation of Ser. No. 07/807,007, filed Dec. 13, 1991, now abandoned; Ser. No. 08/173,738, filed Dec. 23, 1993, now allowed; U.S. Pat. No. 5,526,472; and U.S. Pat. No. 5,525,982.

FIELD OF THE INVENTION

The present invention relates generally to systems and methods for compressing data. More particularly, the invention is directed to systems and methods for implementing a sliding window type Lempel-Ziv data compression algorithm.

BACKGROUND OF THE INVENTION

Digital data compression is a technology experiencing accentuated interest in the recent years. In part, this is a consequence of the broad use of personal computers and workstations having high resolution graphic display systems. The volume of the digital data used to represent the video information, as well as the speed with which it must be compressed and decompressed, in the course of storage or transmission has motivated significant investigation in the technologies related to data compression.

A data compression algorithm which has proven to be quite popular was first described in an article entitled "A Universal Algorithm for Sequential Data Compression" by authors Lempel and Ziv, as appeared in the IEEE Transactions on Information Theory, Vol. IT-23, No. 3, pp. 337–343, 1977, generally referred to as the LZ-1 data compression algorithm. The LZ-1 algorithm has been refined in various respects by subsequent investigators, examples being the variance described in U.S. Pat. Nos. 5,003,307 and 5,146,221, the subject matter of which is incorporated by reference herein.

The fundamental concepts which characterize these and other versions of the basic LZ-1 algorithm involve the use of a buffer to store new data and to identify new strings of data which match previously received and processed data. Thereby, new strings of data, typically alphanumeric characters, which match existing strings can be identified by merely referring to an offset and length in an earlier point in the string sequence. The LZ-1 algorithm is dynamic in that new data is entered into the buffer which stores the earlier data after the comparison and encoding of new data is completed. The size of the buffer is analogous to a sliding window over a data stream in which the new data characters are always compared to previously received characters within the length of the window. The encoded output is either a raw/literal character, indicating no compression, or a compressed/string character, providing a length and offset identifying the matching previously existing character string within the window. As would be expected, the algorithm is increasingly effective as the size of the window increases and repetition of the patterns in the data characters within the window increases.

However, the classical LZ-1 algorithm suffers from the need for extensive comparison between the data characters within the window and various combinations of new data characters. As a consequence, implementations involving large sliding window buffers seldom complete exhaustive searches of the window data for data character matches.

The aforementioned U.S. patent application Ser. No. 08/537,569 relates to a high speed hardware implementation of the LZ-1 algorithm, the subject matter which is incorporated by reference herein. U.S. Pat. No. 5,526,472 relates to a toroidally implemented circular bit shift register which is characterized by its high speed of accomplishing linear shift operations in a conventional processor environment. U.S. patent application Ser. No. 08/173,738 relates to a new way of practicing the LZ-1 algorithm, involving the use of a data character addressed history buffer with shifting entries and various registers for comparing, tracking and counting markers associated with the presence and order of data characters.

The data compression implementation according to U.S. patent application Ser. No. 08/173,738 involves extensive shifting of bits in unison within the history table, or individually with selective update, and is therefore not particularly adapted to execution by a conventional processor. Though barrel shifters can be used to shift the markers in the history buffer, the operational widths of barrel shifters typically conform to the processor operand size. In contemporary designs this is 32 bits. In contrast, the length of the bit string of markers in a typical row of the history buffer is at least 512 bits, requiring 16 operations by a 32-bit barrel shifter to complete processing.

Therefore, there remains a need for systems and method which provide exhaustive sliding window data compression while reducing the number of shift operations and minimizing the number of such shift operations to the extent that they do exist.

SUMMARY OF THE INVENTION

The present invention defines a lossless data compression system, comprising a means for receiving successive data of different characters, means for marking a memory to indicate the receipt of a first data character and its order of occurrence, means for marking the memory to indicate the receipt of a second data character and its order of occurrence, means for detecting a string match between an order of successive new data characters and the first and second data characters by copying, shifting and comparing marked position from the memory, and means for encoding new data responsive to the means for detecting a string match. In another form, the invention relates to methods for performing the operations characterized by the aforementioned apparatus.

In one form, the present invention defines a refined combination of the teachings in aforementioned U.S. patent application Ser. No. 08/173,738 and U.S. Pat. No. 5,526,472, where the history buffer is managed by a pointer and the comparison data in registers is shifted using a circular bit shift register of toroidal form. The use of a pointer avoids the need for shifting the numerous marker bit strings in the history buffer, but necessitates the shifting of comparison data in a related register. In view of the earlier noted limitations of barrel shifters, and the absence of barrel shifters in many processors, the long bit string is optimally shifted using the preferred toroidal bit shift register.

A preferred implementation of the invention involves the use of a large character history bit pattern memory of matrix form in which the row addresses uniquely correspond to different data characters and the column address is specified by an indexed or incremented pointer. Together the addresses uniquely identify a memory cell storing a marker bit. The pointer is incremented with the receipt of each successive data character subject to comparison. The onset and continuity of data character string matches is accomplished with registers which are used to copy marker patterns from the memory, which provide information identifying continuing matches, which store logical AND combinations of marker data, and which are bit serially rotated in relative synchronism with the pointer as new data characters are evaluated. The sliding window data compressions so accomplished are exhaustive as to the memory content. The output of the compression is a succession of raw/literal or compressed/string tokens which represent the data in a lossless format.

The use of the toroidal bit shift register architecture to accomplish the bit wise shift of marker related to data in a register permits the shift to be accomplished with minimum operations in a generic processor. The linear pattern of the marker bits in the register are translated into a matrix and efficiently manipulated in that format to accomplish the shift.

The present invention lends itself to high speed lossless exhaustive sliding window data compression which can be efficiently accomplished with conventional data processors.

These and other features of the invention will be more fully understood and appreciated upon considering the description of the detailed embodiment set forth hereinafter.

DESCRIPTION OF THE PREFERRED EMBODIMENT

Figure 1:
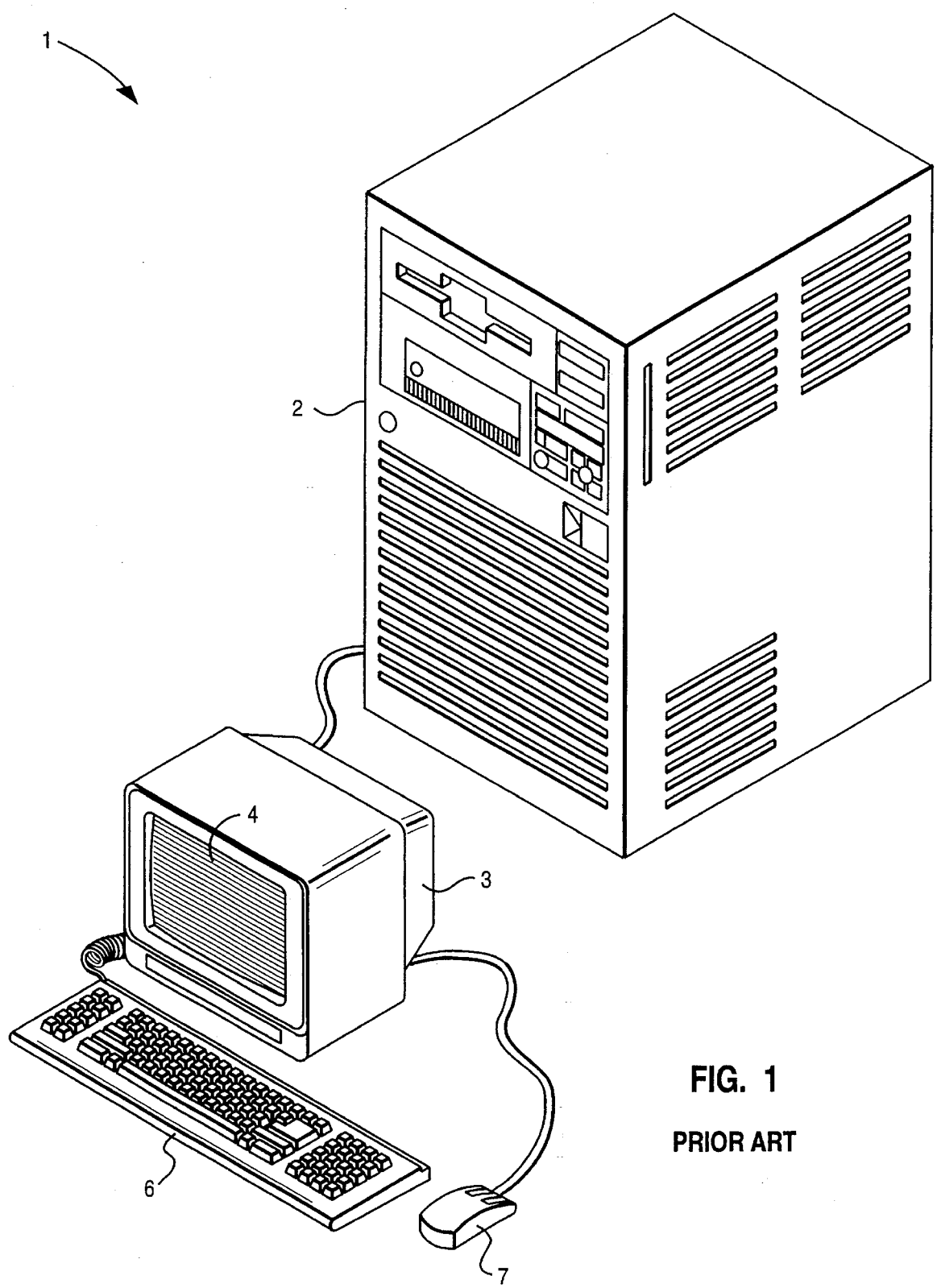
FIG. 1 depicts a personal computer or workstation system.

The fundamental concepts of Lempel-Ziv data compression have been well known for years, as evidenced by the date of the initial technical publication and ensuing refinements thereof. The present invention is directed to systems and processes which refine and extend the basic principles in the Lempel-Ziv data compression algorithm variant generally known as LZ-1.

In general, the LZ-1 algorithm achieves compression by creating and maintaining a data structure, generally called a history buffer, which represents the succession of previously received data characters. New data characters are compared individually and in successively longer strings to the data character patterns in the history buffer for matches. When such matches are detected, the output from the data compressor is a compressed/string token which references the length and position of the existing data character string rather than explicitly coding that string. Data characters not within the history buffer are issued as raw/literal tokens. The larger the history buffer and more repetitive the data character patterns, the greater the effective data compression that can be accomplished.

The LZ-1 data compression algorithm is lossless in that each incoming character is represented in the compressed form as either a raw/literal token or a part of a compressed/string token.

In the context of such prior art practice an input data character not subject to compression is issued as a raw/literal token, composed of a binary "0" followed by 8 bits representing the character. A compressed/string token is composed of a binary "1" followed by two strings of bits, the first string representing the length of the corresponding previously existing data character string and the second string representing the position or relative position of the prior character string in the history buffer.

During decompression, the raw/literal and compressed/string tokens are translated in a complementary fashion, whereby the raw/literal tokens are translated directly into the corresponding characters and compressed/string tokens are translated by reference to previously translated tokens in a decompression buffer.

Implementations of the LZ-1 data compression algorithm through software manipulation are subject to the constraints characterizing conventional processors. For example, the refined implementation in U.S. patent application Ser. No. 08/173,738 defines an arrangement for exhaustively searching a large sliding window but requires shifting of numerous extensive bit strings. Unfortunately, general purpose processors are not efficient at shifting extremely long strings of data bits. Though barrel shifters are available in some processors, the barrel shifters still manage data shifting typically only by the operand width of the processor.

A refined system and method for circularly shifting by one bit position long strings of bits is described in U.S. Pat. No. 5,526,472. The system and method define the management of a single string of bits to accomplish a circular shift. Unfortunately, the refined history buffer architecture described in U.S. patent application Ser. No. 08/173,738 involves the shifting of multiple bit strings, each of a bit width equal to the sliding window size in bytes.

The invention as embodied herein defines a system and method for efficiently compressing data characters, in a format suitable for a conventional decompression, using a general purpose personal computer or workstation, such as the one depicted in FIG. 1. Workstation system 1 includes cabinet 2 which houses the volatile and non-volatile memory, the processor, and the input/output (I/O) system. The I/O system provides access to external communications resources as well as communication between workstation resident tape drives, floppy disc drives, hard disc drives and CD disc drives. FIG. 1 shows that the preferred system includes a video display 3 with screen 4, a keyboard system 6 and a mouse controller 7. All such devices are well known in the industry.

Figure 2:
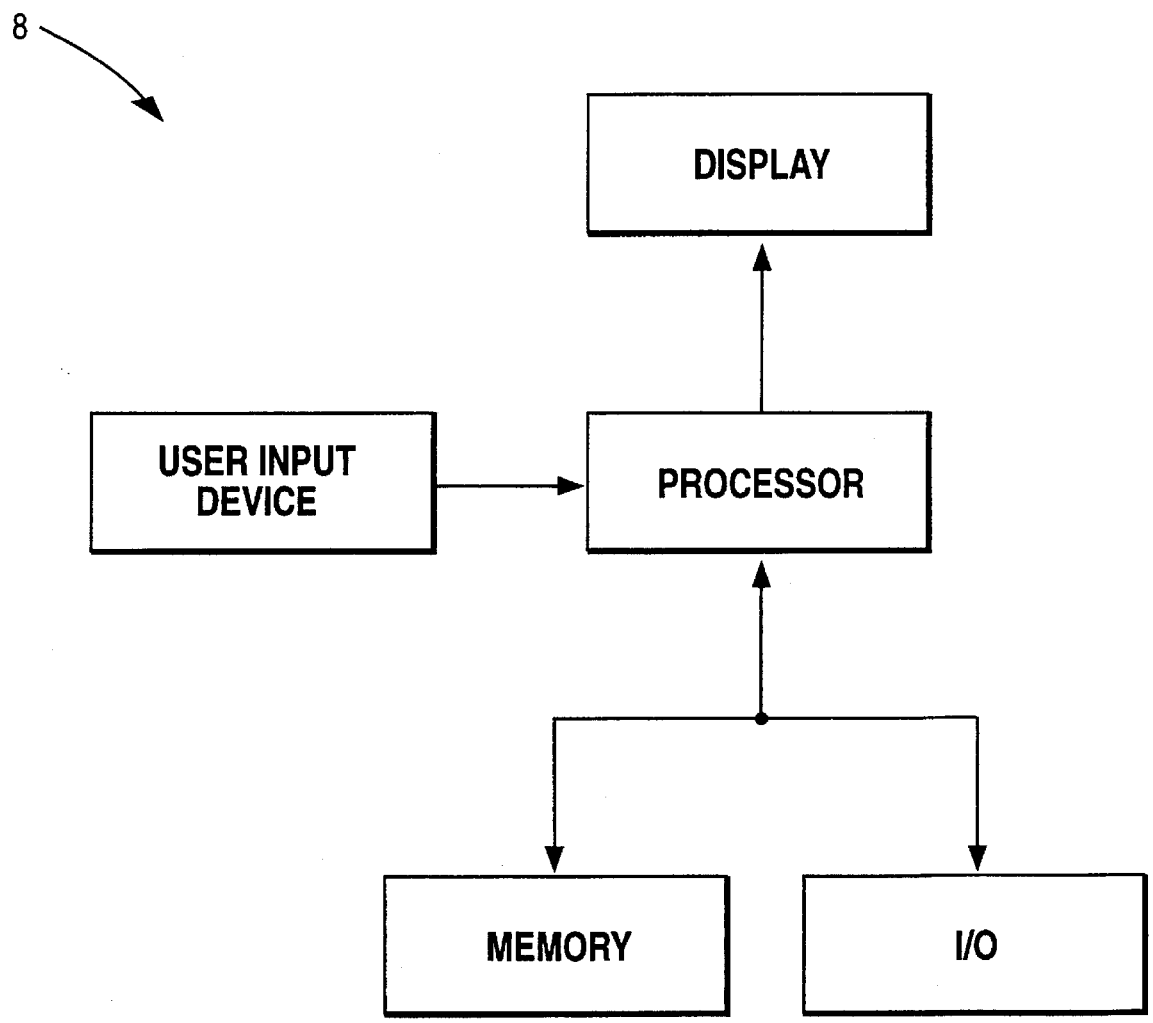
FIG. 2 schematically depicts by block diagram the relation of the processor to the various other elements in a personal computer or workstation system.

FIG. 2 depicts by block diagram the functional interconnection of the elements from FIG. 1. Though system 8 as depicted in FIG. 2 is generic, it represents the operating environment within which the present invention may be practiced. Namely, it indicates that data compression of the form and in the manner now described does not require specialized hardware or system configurations.

Figure 3:
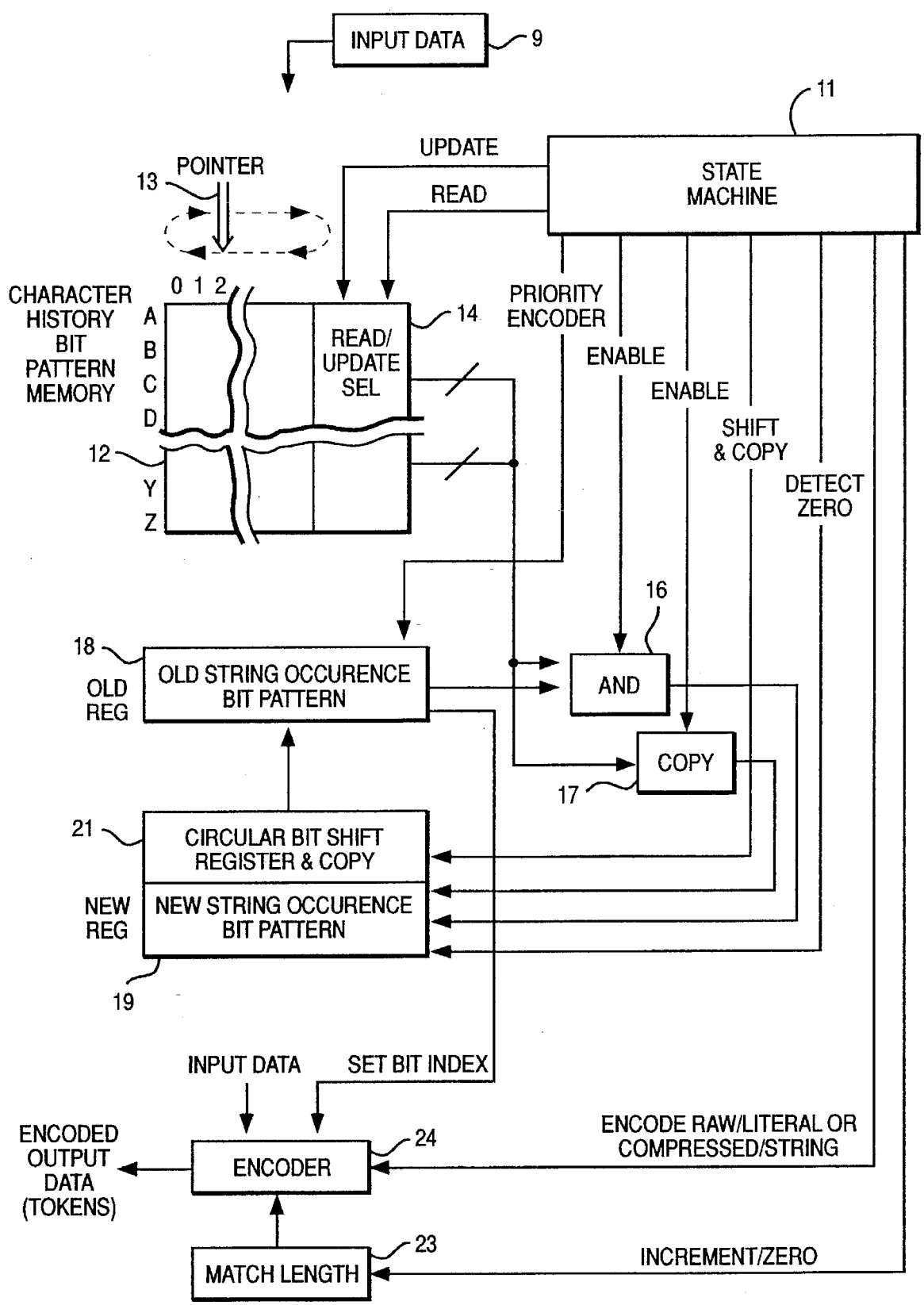
FIG. 3 depicts by schematic block diagram the functional elements which comprise one embodiment of the present system.

FIG. 3 depicts by functional blocks the elements and operations needed to accomplish data compression in the manner characterizing the present invention. The functions are preferably accomplished within the processor. The memory is preferably the cache or main memory of the processor. Although the registers can be the processor registers, they will more likely be uniquely defined sections of the cache or main memory.

The input data 9 in FIG. 3 provides a serial succession of data characters, such as the classic alpha numeric characters represented, by the 8-bit (byte) ascii character string. As each character is received, state machine 11, programmed within the processor, undertakes specified operations within the system by generating control signals or sending data to the related functional elements. Character history bit pattern memory 12 stores marker bits at locations in the matrix coincident with new data characters (specifying a row address), and the order of occurrence of that character as defined by circular pointer 13 indexed or incremented with the processing of new characters. The pointer identifies the column position of the marker corresponding to a new character. Addressing of the markers in memory 12 is responsive to update and read signals generated by state machine 11, as implemented through the read/update select section 14 of memory 12.

The rows of marker bits for each character within memory 12 are selectively conveyed to AND block and COPY block 17. AND block 17 is selectively enabled by state machine 11 to perform a bit wise AND operation on a row from memory 12 with a corresponding string of bits in OLD register 18, and to provide the outcome by bit to lower portion 19 of the NEW register. COPY block 17 is selectively enabled by state machine 11 to convey a row of marker data bits to register 19. The NEW register also includes functional block 21, block 21 having resources to provide a toroidal type circular bit shift and a COPY upon enablement by state machine 11. The shifted and copied marker bits are selectively transferred from the NEW register to OLD register 18. An efficient way to accomplish the shift between registers 21 and 18 is to ping-pong the two registers during operation.

As state machine 11 cycles with the receipt of new input data characters, matches to the strings of previously received data characters, as represented by the pattern of markers in character history bit pattern memory 12, are counted in match length block 23. Encoder 24 generates encoded output data tokens representing the input data characters received from block 9. If an input data character is to remain in the raw/literal form, state machine 11 enables encoder 24 accordingly. In contrast, when the encoder output is to be a compressed/string token, the issuance is delayed until the maximum length input data character string can be represented by a single token. The length of the compressed/string token is provided by block 23, while the location of the matching character string is derived from the set bit index provided by OLD register 18.

What makes the present invention particularly valuable is the combined use of an entry pointer to distribute new data characters into history buffer array locations in a circular fashion, together with the use of a circular bit shift register, such as the preferred toroidal bit shift register, to shift occurrence bit patterns in synchronism with the pointer.

Figure 4A:
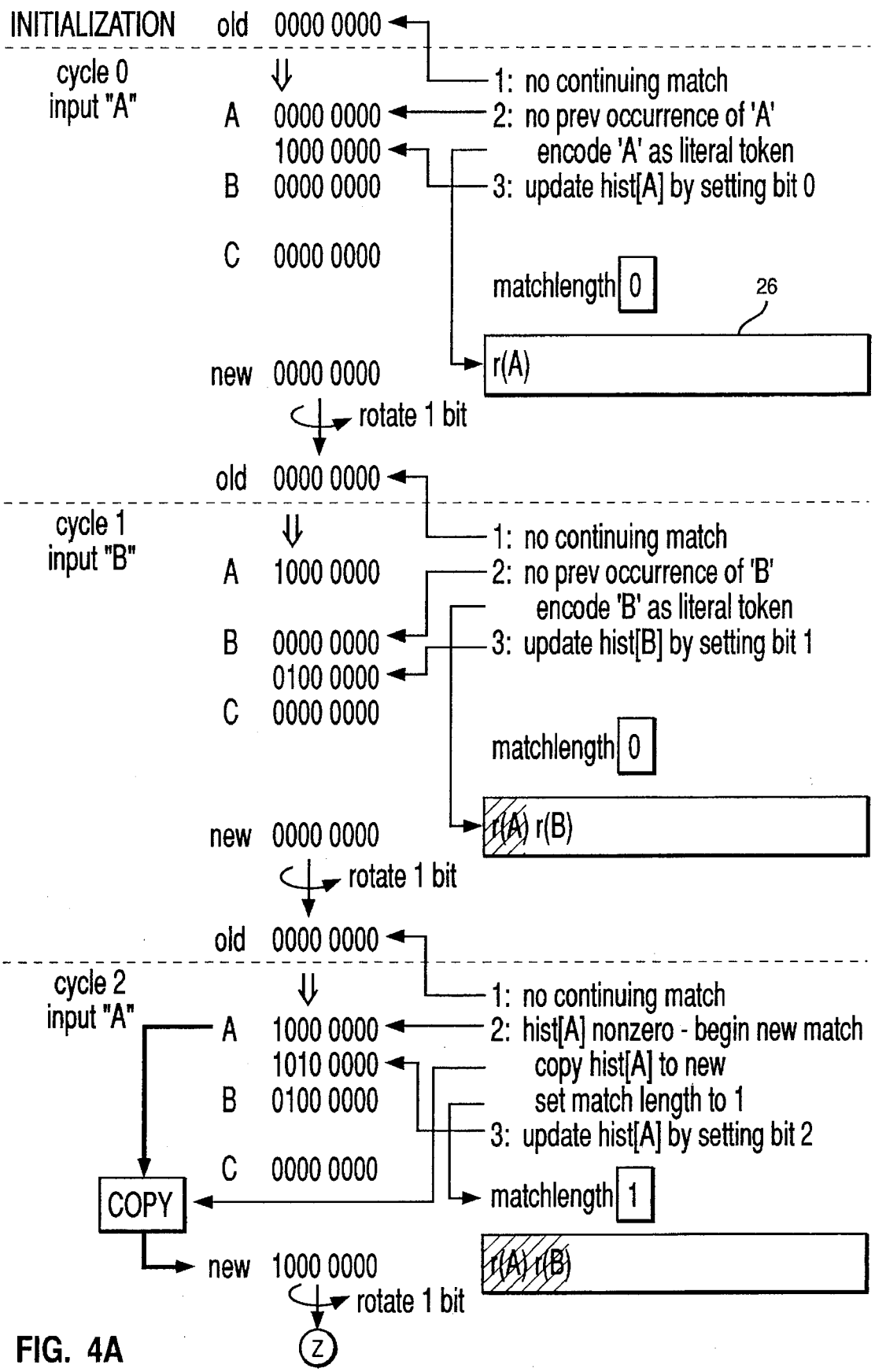
FIGS. 4A and 4B schematically depict the status of markers in the memory and registers as relates to the encoding of the data characters "ABABC".
Figure 4B:
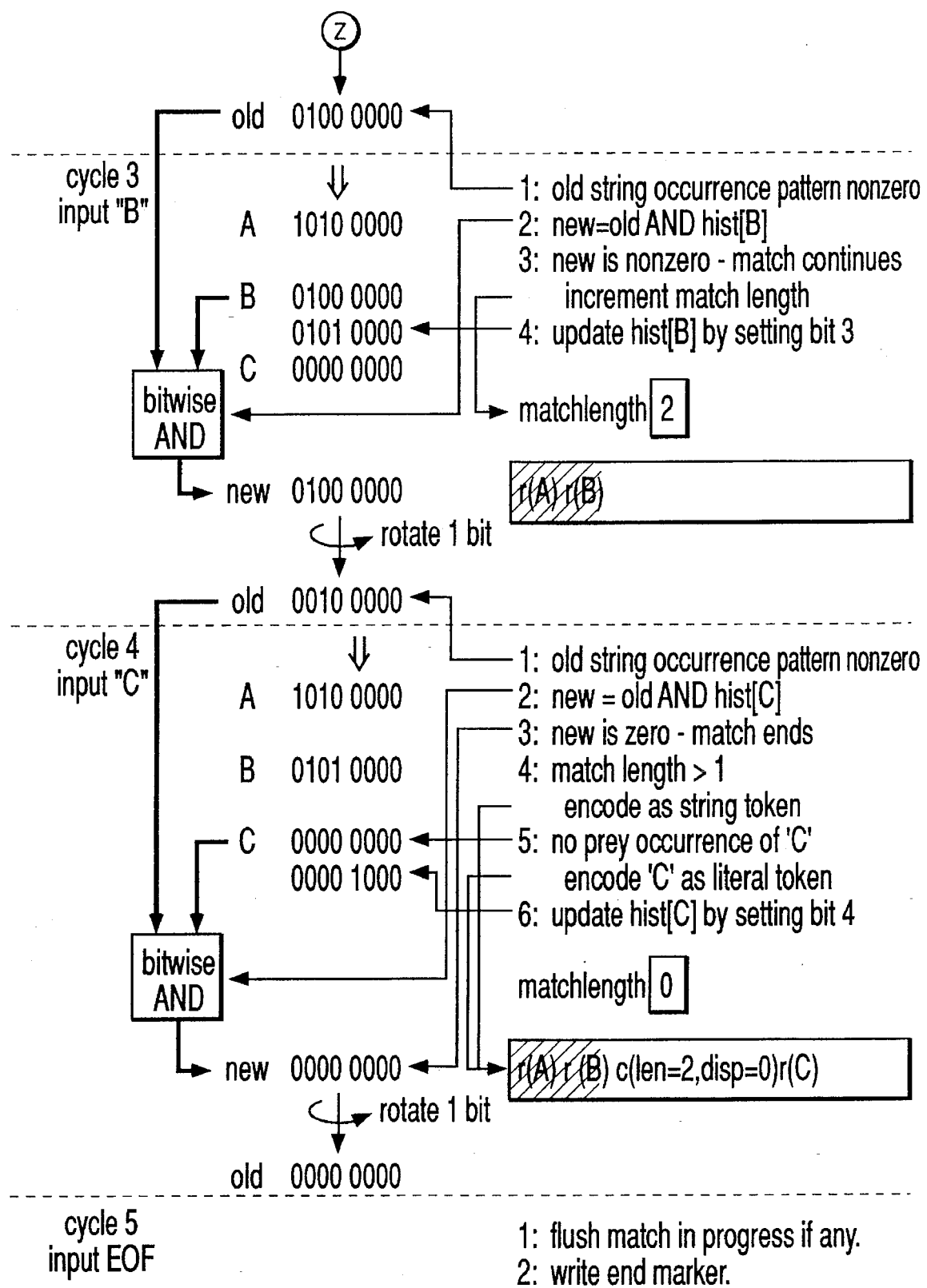

FIGS. 4A and 4B illustrate by example the use of the invention to compress a sequence of input data characters, the sequence being the character string "ABABC". The character string "ABABC" is compressed in the succession of operational cycles 0–4, with cycle 5 performing an end of termination or initialization operation. For purposes of this illustration, character history bit pattern memory 12 (FIG. 3) is eight positions in length, has a matching circular column pointer, and is composed of three rows individually ascribed to characters A, B and C. The operations and effects associated with each cycle and input data character are described and depicted at the right.

The compression of the input data character sequence commences with an initialization, wherein the memory registers are all zeroed. At cycle zero, the input data character is "A". Reference to the OLD register indicates there is no continuing match status. Reference to the "A" character row indicates the presence of no markers, establishing no previous occurrences of "A" Therefore, "A" is encoded immediately as a raw/literal token r(A) as shown in output sequence 26. Since no match was identified, the match length must be zero. After the raw/literal token is generated, a marker bit is placed in the leftmost location of the row corresponding to the "A" history. The location is designated by the pointer. A rotation of the marker pattern in the NEW register and a transfer into the OLD register concludes cycle zero.

Cycle 1 illustrate the processing of a subsequent input data character "B" An evaluation of the marker pattern in the OLD register again indicates the absence of a continuing match, by the lack of any 1s. The absence of any 1s in the "B" row of the memory indicates no previous occurrences of the "B" Therefore, raw/literal token r(B) is generated immediately for the input data character "B" The memory row for the "B" data characters is then updated with a marker, in this case situated in the next column as specified by the incremented pointer. The match length remains O. The marker data in the NEW register is again rotated by the toroidal bit shift register, by one bit position, and entered into the OLD register.

Cycle 2 represents the evaluation of the next input data character "A" Again, an examination of the OLD register indicates the absence of a continuing match. However, an examination of the "A" character row indicates a non-zero marker location, signaling the beginning of a match. Accordingly, the COPY function is initiated to copy the row of marker data corresponding to the "A" character into the NEW register, and the match length function is correspondingly incremented by one. Thereafter, the "A" row in memory is updated by the addition of a marker in the column designated by the indexed pointer. Note that no tokens are issued by the encoder.

Cycle 3, the processing of next successive character, begins as shown in FIG. 4B with an examination of the bits in the OLD register. The presence of a nonzero bit represents a continuing match status. In such case, a bit wise AND is performed between the bits in the OLD register and marker bits in the "B" row of the memory. The outcome of the AND operation is provided as a string to the NEW register. Since the outcome in the NEW register is non-zero, a continuing match condition is indicated and the match length is indexed or incremented by one from its prior value. The "B" data character row in memory is then updated with a marker coinciding with the shifted pointer, in this case adding a one to the fourth position from the left. Note again that no token is issued.

Cycle 4, the receipt of the "C" input data character, commences with an examination of the OLD register and a responsive conclusion that a continuation of a match is still in progress. A bit wise AND of the OLD register with the markers in the "C" register produces an outcome which is entered into the NEW register. An examination of the bits in the NEW register indicates that the match with a prior character string was terminated with the "C" character. Since the match length, namely the character string "AB" is greater than one, a compressed/string token is issued. The token C(len=2, disp=0) indicates a match length of two and a displacement of zero, the latter location defined by the onset of the match. An examination of the markers in this "C" data character row indicates no prior occurrence of "C", resulting in the generation of a raw/literal "C" token. The "C" row in the memory is then updated with a marker as indicated by the indexed pointer. Note that during cycle 4 two tokens were issued, the first being a compressed/string token and the second being a raw/literal token. The issuance of the first token is motivated by the end of a string match while that of the second token is attributable to an absence of any markers in this "C" row during the preceding four cycles.

Cycle five is a termination cycle to reset the example system.

The embodiment described with reference to FIGS. 4A and 4B utilizes a pointer which is successively indexed or incremented through the column addresses of the character history bit pattern memory in an endless circular loop. The rotate one bit operation performed in anticipation of a transfer from the NEW register to the OLD register, before the commencement of a new cycle, involves a circular bit shift preferably performed by a toroidal bit shift register.

It should be apparent that increasing the number of characters subject to encoding increases the number of rows in the memory array, while increasing the size of the history through which the match is undertaken increases the number of columns in the memory array. The example also illustrates that the system and method of the present invention completes an exhaustive search of the history in memory for all incoming character strings, to identifying the longest matching sequence. Foremost, note that the rows of the memory are not shifted with each cycle as characterized by prior practices, but rather rely upon a pointer. The rotation of the bit pattern by one bit position per incoming character is performed in a highly efficient manner for very lengthy bit strings without resort to barrel shift registers and within the framework of conventionally architected processors. The unique efficiency of the toroidal bit shift register will be described hereinafter.

Figure 5A:
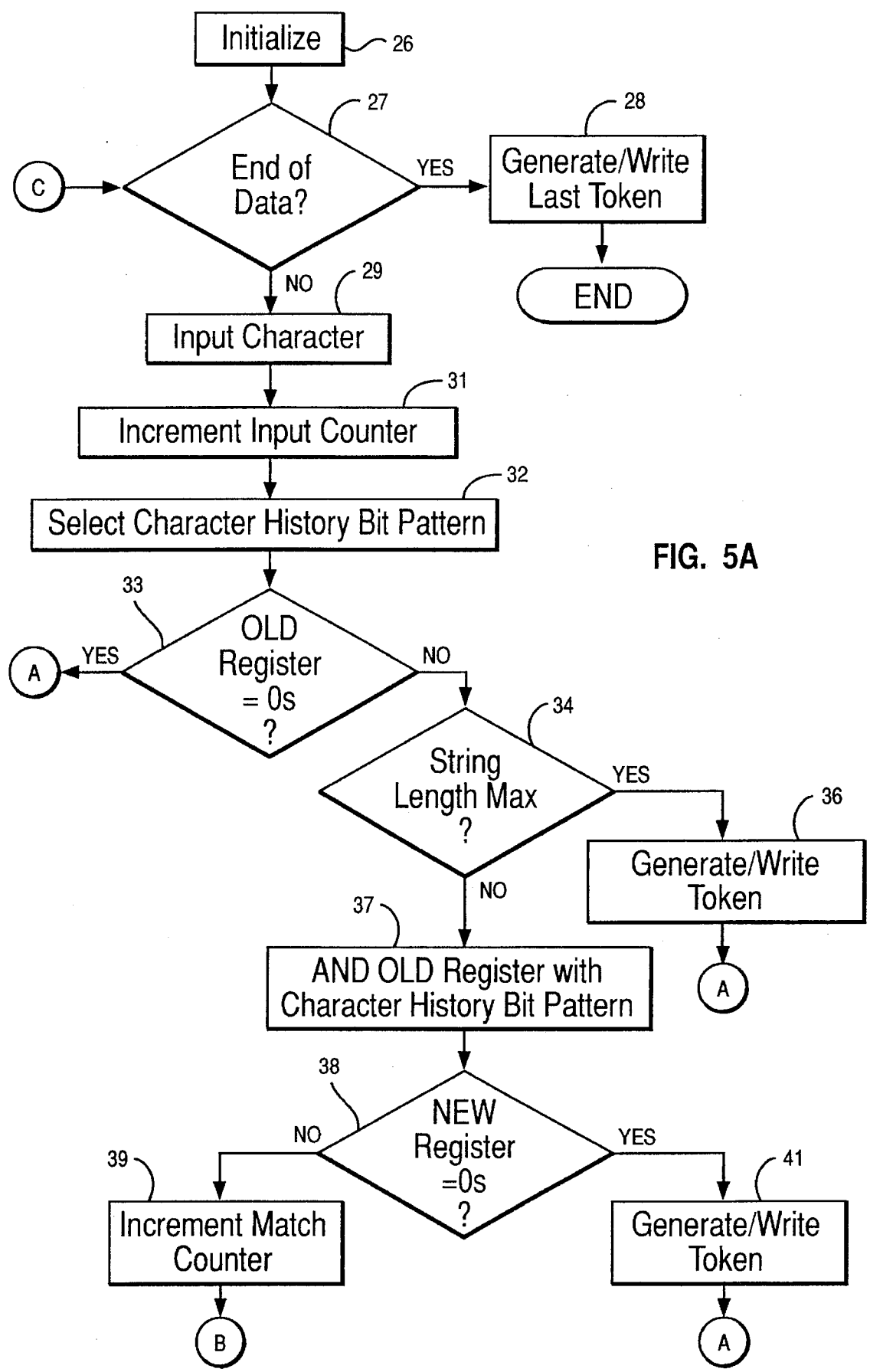
FIGS. 5A and 5B provide by flow chart the operations characterizing FIGS. 3, 4A and 4B.
Figure 5B:
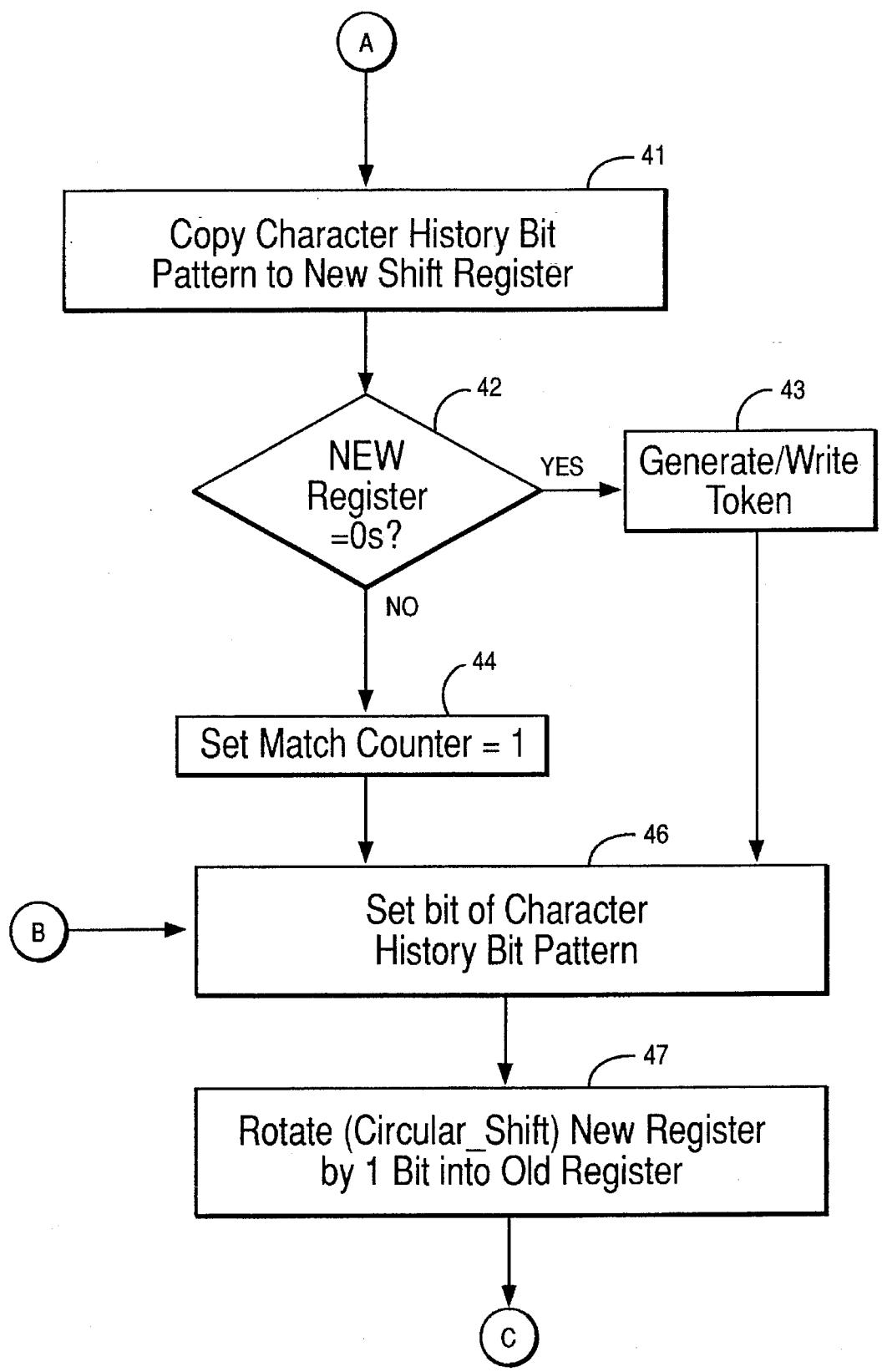

FIGS. 5A and 5B depict by generic flow diagram the operations performed to process input data characters, as exemplified in FIGS. 4A and 4B. Elements 26, 27, 28, 29, 31 and 32 describe the management of the initialization and conclusion, as well as the selection of the characters from the character history bit pattern in the memory. Element 33 relates to the evaluation of the match for continuity. Elements 34 and 36 relate to the generation of a token upon the finding of a full length match. Element 37 relates to the bit wise AND operation of the OLD register data with the markers in the character history bit pattern. Element 38 involves the determination of whether a token can be generated in element 41, or whether the match length should be incremented as indicated in element 39. Element 41 relates to a copying of the character history bit pattern responsive to an outcome of element 33, indicating all zeros in the OLD register. Element 42 involves an evaluation of the bits in the NEW register, which results in either a token generation according to element 43 or a setting of the match counter back to one according to element 44. The operation defined in element 46 is accomplished in succession after the completion of element 39, the completion of element 43 or the completion of element 44. The rotation of the new register by one bit position is defined in element 47, which upon conclusion returns the operating sequence back to element 27.

Referring briefly back to the functional block diagram in FIG. 3, recall that the key distinctions which characterize and make valuable this invention over the teachings in U.S. patent application Ser. No. 08/173,738 involve the use of a pointer to avoid the need for shifting markers within character history bit pattern memory 12, and the use of a circular bit shift register, the preferred toroidal bit shift register, to accomplish the circular bit shift ascribed to block 21 of the NEW register. The goal is to allow a general processor to rapidly compress data, thereby requiring that the number of circular bit shift registers be minimized and that such remaining circular shift function be accomplished with minimum complexity and time delay. The present invention reduces the circular bit shift register count down to a single unit and optimizes that unit through the use of the toroidal bit shift register architecture and method of operation.

Figure 6:
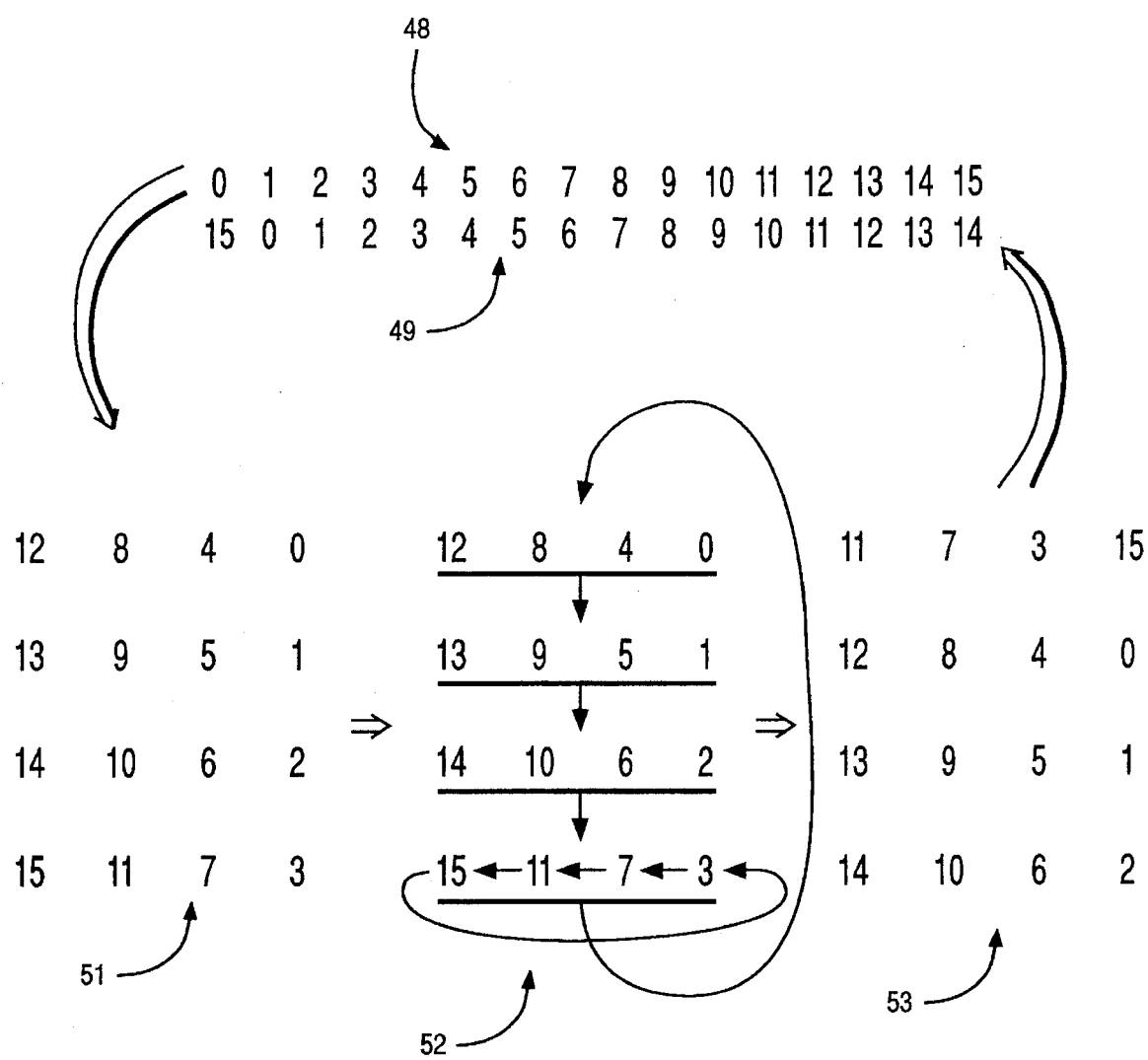
FIG. 6 schematically depicts the operation of a toroidal shift register.

The toroidal bit shift register is described in U.S. Pat. No. 5,526,472. The particulars of the toroidal bit shift register are schematically depicted in FIG. 6, where a 16-bit position pattern (0–15) is shown undergoing a circular shift by one position. The goal is to progress from the linear string at 48 to the one bit circular shifted string at 49 with minimum expenditures of processor resources and time. This is accomplished according to the toroidal bit shift register by first transforming the linear pattern at 48 into the matrix pattern at 51. Next, a single bit circular shift of one row from within matrix 51 is followed by an indexing of the row pointer by one position. These operations are schematically depicted within the matrix at 52. The end result is the matrix at 53. The matrix at 53 is then transformed back to the linear format at 49. Note that only one row of the matrix required a single bit circular shift, in the example involving the shift of 4 bit positions in contrast to the original need for shifting 16 bit positions.

Figure 7A:
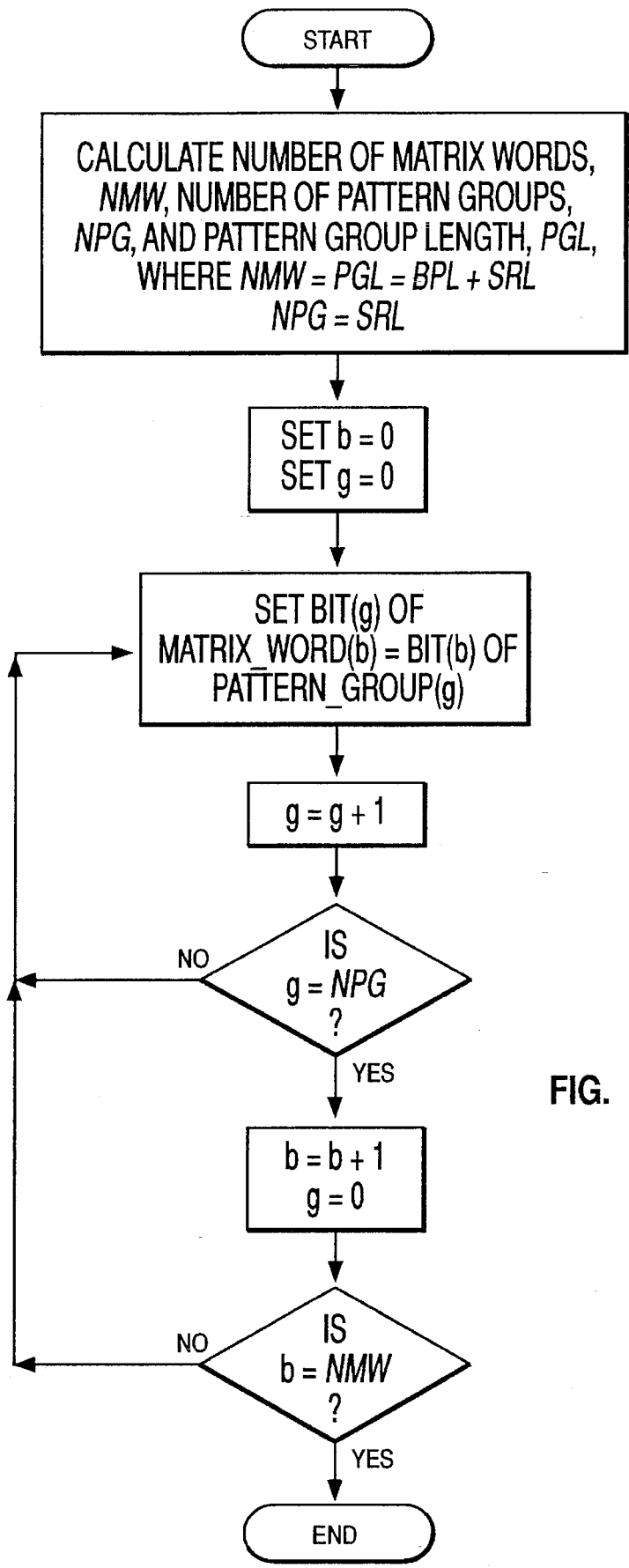
FIGS. 7A, 7B and 7C provide by flow chart descriptions of the matrix formation and manipulation to accomplish a toroidal bit shift operation.
Figure 7B:
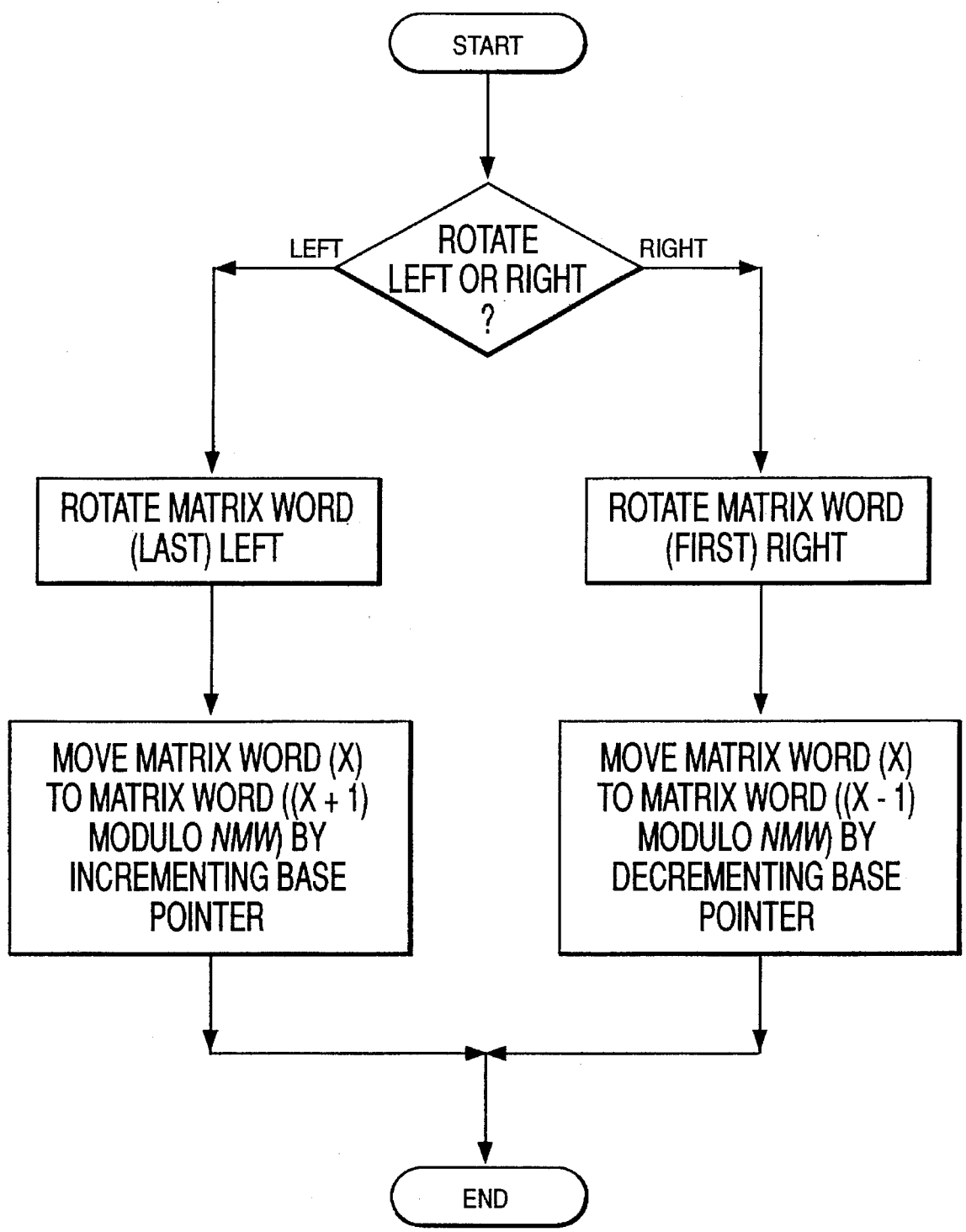
Figure 7C:
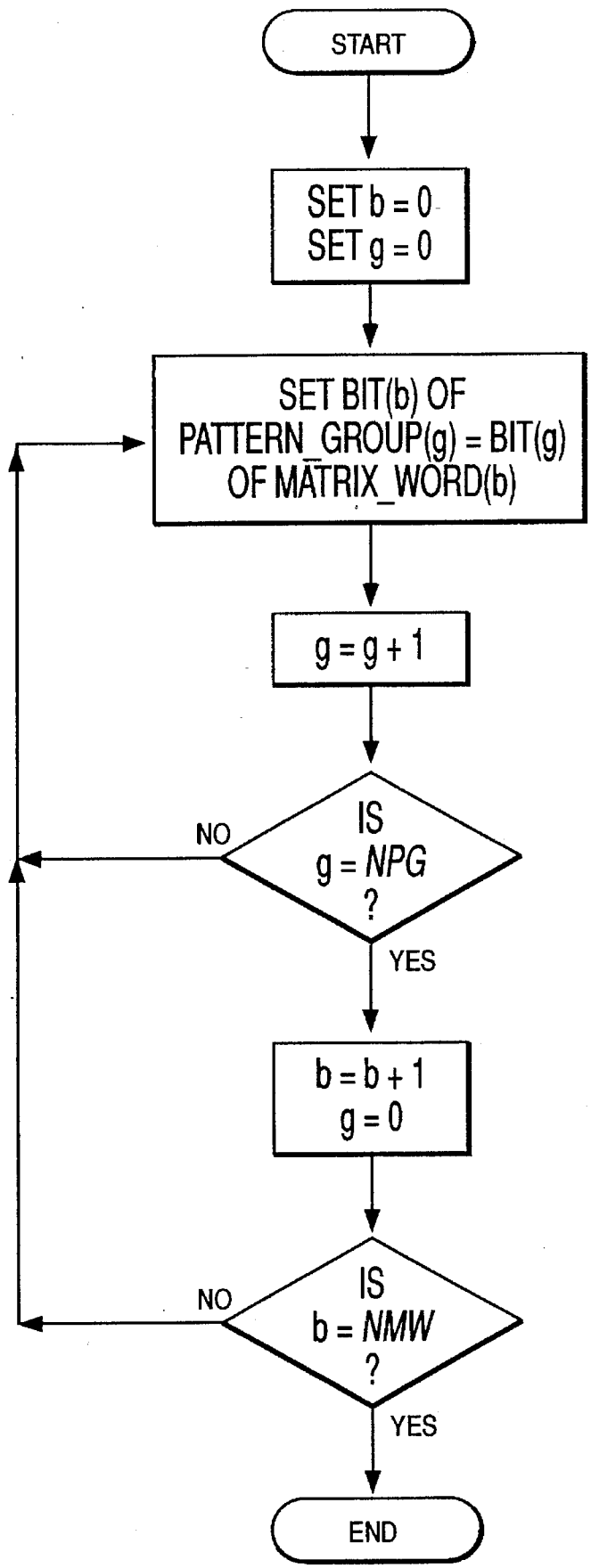

FIG. 7A depicts by a flow chart the operations performed to arrange a linear bit string, such as 48 in FIG. 6, into the matrix format 51 in FIG. 6. The flow chart in FIG. 7B indicates the operations undertaken by a processor to perform the functions schematically depicted in the matrix at 52 in FIG. 6, namely the circular shift of a row and indexing of the row pointer. FIG. 7C depicts the flow chart for a processor executing the regeneration of the linear format at 49.

Decompression of the tokens generated by the system depicted in FIG. 3 involves nothing more than conventional decompression practices. In general, the tokens are parsed into the raw/literal and compressed/string elements. The literal elements are nothing more than the direct representations of the data character conveyed. In contrast, the compressed/string tokens are decoded to identify the locations and lengths of preceding strings of characters as stored within a conventional linear decompression buffer. The data character string so identified is then inserted in the appropriate location within the sequence entered into the buffer. Movement within the linear buffer is readily accomplished using a pointer.

The present invention significantly improves the speed of exhaustive sliding window data compression over large windows using conventional processors.

Program code suitable to tuning the character history bit pattern for increased performance during compression is set forth below.

```
hmaint(c,pc)    /* maintain history bit patterns once per input byte */
int c,pc:
{
register unsigned row,col; /* temp variables to map bit pos in tsr to disp */
register unsigned colbit, rowbit;
      col = (bin >> 4) & 31;
      row = bin & 15;
      colbit = 1 << col;
      rowbit = 1 << row;
#if SMALL_PAGES
      if( hind[c] & rowbit)
         history[c][row] |= colbit;
      else
         history[c][row] = colbit;
#else
         history[c][row] |= colbit;
#endif
      hind[c] |= rowbit;
      if( bin >= HIST LEN){
         if(!(history[pc][row] &= ~colbit))
            hind[pc &= ~rowbit;
         }
}
```

A subroutine for rapidly performing the AND operations between bit patterns ascribed to block 16 in FIG. 3 is set forth below.

```
c_pat_X_hist(possible, hist, pattern )
unsigned register possible; /* value in this is really type short (16 bits)*/
unsigned int hist[ ];
unsigned int pattern[ ];
{
unsigned register newhits;
register int f;
unsigned register b,r,np;
unsigned int pi,pl;
      newhits = 0;
      pl = pat_len;
      do {
         f = smart_first_set_bit(possible );
         b = 1 << f;
         pi = (f - pl) & 15;
         r = pattern[pi];
         if( np = r & hist[f] ){ /* it is very important NOT to store a zero result
            back to the pattern, because if the overall result is zero, we need to go
            back and find a set bit from the previous pattern to generate the displacement.
            This avoids all the data movement in having an old and new copy of the string
            ocurrence history bit pattern, i.e. an alternating buffer. We can do this
            because in this code a history word is never referenced if its index bit is
            clear. */
         /* if(np !=r) */
            pattern[pi] = np;
               /* technically we dont have to do the store if the value has not
               changed, however the compare and branch may be more costly than the
               store, since this location is now in the cache and the eff address
               has already been computed above. This is why the np != r test is
               commented out. */
         newhits |= b;
            /* set the bit in result index that indicates the indexed word in new
            occurrence pat contains ones. */
         }
      }
      while( possible &= ~b);
      return hewhits;
}
```

Though the invention has been described and illustrated by way of a specific embodiment, the systems and methods encompassed by the invention should be interpreted to be in keeping with the breadth of the claims set forth hereinafter.

We claim:

1. A data compression system, comprising:

means for receiving successive data characters;

means for marking a memory to indicate the receipt of a first data character and its order of occurrence;

means for marking the memory to indicate the receipt of a second data character and its order of occurrence;

means for detecting a string match between the order of successive new data characters and the first and second data characters by copying, shifting with a toroidal bit shift register, and comparing marked positions from the memory; and means for encoding new data responsive to the means for detecting a string match.

2. The apparatus recited in claim 1, wherein the means for marking a memory comprises a pointer which increments a memory address for successive data characters.

3. The apparatus recited in claim 2, wherein the means for marking uses a memory address specified by a data character comparator.

4. The apparatus recited in claim 3, wherein the combination of memory addresses specified by the pointer and by the data character comparator uniquely identify a position in the memory.

5. The apparatus recited in claim 3, wherein the combination of memory addresses specified by the pointer and by the data character comparator uniquely identify a position in the memory.

6. The apparatus recited in claim 1, further comprising a means for decoding encoded string matched data characters.

7. A data processing system, comprising:

a memory;

a processor connected to the memory;

means for receiving successive data characters by the processor;

means for the processor to mark the memory to indicate the receipt of a first data character and its order of occurrence;

means for the processor to mark the memory to indicate the receipt of a second data character and its order of occurrence;

means for detecting a string match between the order of successive new data characters and the first and second data characters by copying, shifting with a toroidal bit shift register, and comparing marked positions from the memory; and means for the processor to encode new data responsive to the means for detecting a string match.

8. The apparatus recited in claim 7, wherein the means for the processor to mark the memory comprises a pointer which increments a memory address for successive data characters.

9. The apparatus recited in claim 8, wherein the means for the processor to mark the memory system uses a memory address specified by a data character comparator.

10. The apparatus recited in claim 7, wherein the combination of memory addresses specified by the pointer and by the data character comparator uniquely identify a position in the memory.

11. A method of compressing data, comprising the steps of:

receiving successive data characters;

marking a memory to indicate the receipt of a first data character and its order of occurrence;

marking the memory to indicate the receipt of a second data character and its order of occurrence;

detecting a string match between the order of successive new data characters and the first and second data characters by copying, shifting with a toroidal bit shift register, and comparing marked positions from the memory; and encoding new data responsive to the means for detecting a string match.

12. The method recited in claim 11, wherein the step of marking a memory is performed with a pointer which increments a memory address for successive data characters.

13. The method recited in claim 12, wherein the step of marking the memory uses a memory address specified by a data character comparator.

14. The method recited in claim 11, wherein the combination of memory addresses specified by the pointer and by the data character comparator uniquely identify a position in the memory.

* * * * *

UNITED STATES PATENT AND TRADEMARK OFFICE
CERTIFICATE OF CORRECTION

PATENT NO. : 5,612,693
DATED : March 18, 1997
INVENTOR(S) : David J. Craft and Oscar C. Strohacker It is certified that error appears in the above-indentified patent and that said Letters Patent is hereby corrected as shown below:

Col. 5, line 29, after AND block, insert --16--;

line 30, after AND block, delete "17" and insert --16--;

Col. 6, line 51, after successive, insert --"B"--.

Signed and Sealed this

Second Day of September, 1997

*Attest:*

BRUCE LEHMAN

*Attesting Officer*    *Commissioner of Patents and Trademarks*